United States Patent [19]
Torelli et al.

[11] Patent Number: 5,818,775
[45] Date of Patent: Oct. 6, 1998

[54] STATIC RAM WITH REDUCED POWER CONSUMPTION

[75] Inventors: Cosimo Torelli, Tortona; Danilo Rimondi, Mozzo, both of Italy

[73] Assignee: SGS-Thomson Microelectronics S.r.l., Agrate Brianza, Italy

[21] Appl. No.: 833,901

[22] Filed: Apr. 10, 1997

[30] Foreign Application Priority Data

Apr. 11, 1996 [EP] European Pat. Off. .............. 96830203

[51] Int. Cl.⁶ .................................................. G11C 13/00
[52] U.S. Cl. ..................................... 365/210; 365/189.01
[58] Field of Search .................................. 365/210, 227, 365/189.01, 230.01

[56] References Cited

U.S. PATENT DOCUMENTS

| | | | |
|---|---|---|---|
| 5,132,931 | 7/1992 | Koker | 365/210 |
| 5,394,354 | 2/1995 | Watabe et al. | 365/51 |
| 5,408,438 | 4/1995 | Tanaka et al. | 365/203 |

FOREIGN PATENT DOCUMENTS 6-139787  5/1994  Japan.

*Primary Examiner*—Terrell W. Fears
*Attorney, Agent, or Firm*—David V. Carlson; Seed and Berry LLP

[57] ABSTRACT

The invention relates to a memory comprising a matrix of memory cells; a plurality of gates for transmitting respective selection outputs of a row decoder to respective rows of the matrix; a dummy bit line having an equivalent load as bit lines associated to columns of the matrix and which is discharged by a dummy memory cell when any row is selected; and circuitry for precharging the bit lines and the dummy bit line when no row is selected, and enabling said gates for transmission of the selection outputs of the row decoder in response to a clock signal. Each gate has an input coupled to the dummy bit line such that the gate is disabled as soon as the dummy bit line has discharged to a switching threshold of the gate.

19 Claims, 4 Drawing Sheets

STATIC RAM WITH REDUCED POWER CONSUMPTION

FIELD OF THE INVENTION

The present invention relates to a memory, such as a Static Random Access Memory (SRAM). The invention aims more specifically at reducing the power consumption of a memory during its access cycles.

DISCUSSION OF THE RELATED ART

FIG. 1 illustrates a conventional architecture of a static RAM, of the type disclosed, for example, in U.S. Pat. No. 5,471,428. The memory comprises a matrix 10 of memory cells 12. Each row of memory cells is selectable for reading or writing by a row selection line RS. Each memory cell of a column is connected between two complementary bit lines BL and BL'. Each bit line is coupled to a high supply voltage Vdd through a precharge MOS transistor MP1 of P-channel type. The two complementary bit lines BL and BL' of each column are connected to a sense amplifier 14.

Each row selection line RS is driven by an AND gate 16 having a first input which receives a common enable signal EN from a control circuit 18. A second input of each AND gate 16 receives a respective selection output S from a row decoder 20. The enable signal EN is also provided to the gates of precharge transistors MP1. The purpose of control circuit 18 and gates 16 is to synchronize the read and write cycles with a clock signal CK received by control circuit 18.

The memory further includes a dummy column comprising a dummy bit line DBL to which is connected, in each row, a dummy memory cell 22. The dummy bit line DBL is connected to voltage Vdd, like the other bit lines, through a precharge transistor MP1 and to the input of a circuit equivalent to the sense amplifier 14, for example an inverter 24. The inverter 24 provides a reset signal RST to control circuit 18. Each dummy memory cell is selectable by the row selection line RS of the corresponding row and permanently stores a state which will discharge the dummy bit line DBL when the dummy cell is selected.

The function of the dummy column is to indicate with reset signal RST, that an access operation of a row has been completed, i.e. that the values provided by the sense amplifiers 14 are stable. For this purpose, the dummy column should react to a row selection in the same manner as a "normal" column of matrix 10. In particular, it is essential that the dummy bit line DBL and the normal bit lines have equivalent loads.

In a static RAM, each memory cell 12 comprises a pair of head-to-tail inverters 26 coupled, at each side, to one of the bit lines BL and BL' through a respective pass transistor MN. Transistors MN are N-channel MOS transistors and their gates are driven by the row selection line RS. Each dummy cell 22 comprises, in this example, a pass transistor MN1 connected to dummy bit line DBL and controlled by the row selection line RS. Inside each dummy cell 22, the pass transistor MN1 is coupled to a low supply voltage Vss through an N-channel MOS transistor MN2. Transistor MN2 has its gate connected to voltage Vdd and is therefore always on.

The shown dummy column is a simplified alternative. In a more accurate alternative, the dummy column is similar to the normal columns, except that the inverters of the dummy cells are connected such that the dummy cells are always at the same state. The inverter 24 is then replaced by a complete sense amplifier.

FIG. 2 shows a time diagram illustrating an access cycle of the static RAM of FIG. 1. The shown waveforms and the delays between transitions are not to scale.

Initially, one selection output S of row decoder 20 is active (not shown on FIG. 2). The corresponding row selection line RS is not asserted immediately. A rising edge of clock signal CK causes the assertion of enable signal EN, which in turn causes the assertion of row selection line RS and turns off the precharge transistors MP1. Dummy bit line DBL starts discharging through transistors MN1 and MN2 of the selected dummy cell 22. In each of the normal columns, either bit line BL or bit line BL' is discharged under the same conditions by the memory cell 12 of the selected row.

When the level of the dummy bit line DBL reaches a threshold Vt of inverter 24, reset signal RST is asserted, causing the fall of enable signal EN, which in turn disables the row selection line RS. The dummy bit line DBL, and therewith the normal bit lines BL and BL', continue discharging as long as the row selection line RS remains asserted. When enable signal EN falls, precharge transistors MP1 are switched on. The precharge transistors MP1 actually start charging the bit lines up to voltage Vdd when the row selection line RS is disabled.

The assertion of the reset signal RST indicates the completion of the access cycle. The reset signal RST falls when the level of dummy bit line DBL rises above the threshold Vt of inverter 24.

Like in any circuit, there is a need for reducing the power consumption in a memory without reducing its performance. A known solution for reducing the power consumption is shown in FIG. 1, i.e. signal EN also enables the sense amplifiers 14 so that they become active and consume power only during a short necessary period of the access cycles. As an alternative, sense amplifiers 14 can be enabled by reset signal RST.

SUMMARY OF THE INVENTION

An object of the present invention is to further reduce the power consumption.

The invention is based on the study of an access cycle, such as illustrated in FIG. 2. It appears that the bit lines continue discharging unnecessarily after reaching the threshold Vt. This unnecessary discharge happens in one bit line of each column and must be compensated by the precharge phase at the end of each access cycle. This causes an unnecessary power consumption which increases with the number of columns. The unnecessary discharge is caused by the delay between the time when the threshold Vt is reached and the subsequent disabling of the row selection line RS. A main contribution to this delay is the time needed for the enable signal EN to fall after the assertion of the reset signal RST. Indeed, the capacitance of the conductors carrying the enable signal EN is particularly large because the enable signal EN is provided to a great number of elements of the memory.

Moreover, when the enable signal EN falls, the precharge transistors MP1 are turned on while a row is still selected and tends to discharge the bit lines (when signal EN falls, row selection line RS remains asserted for a short period). This causes additional power consumption.

A more specific object of the invention is to reduce the power consumption during an access cycle by limiting the unnecessary discharge of the bit lines. The invention achieves this object by disabling each gate driving a row selection line as soon as the dummy bit line has discharged to a switching threshold of the gate.

The invention more specifically provides a memory comprising a matrix of memory cells; a plurality of gates for transmitting respective selection outputs of a row decoder to respective rows of the matrix; a dummy bit line having an equivalent load as bit lines associated to columns of the matrix and which is discharged by a dummy memory cell when any row is selected; and control means for precharging the bit lines and the dummy bit line when no row is selected, and enabling said gates for transmission of the selection outputs of the row decoder in response to a clock signal. Each gate has an input coupled to the dummy bit line such that the gate is disabled as soon as the dummy bit line has discharged to a switching threshold of the gate.

According to an embodiment of the invention, the dummy bit line is associated to a dummy column comprising, in each row, a dummy pass transistor which connects the corresponding gate to the dummy bit line at least while the row is selected, and the control means have an enable output for enabling the gates and selecting the dummy memory cell.

According to an embodiment of the invention, each gate has three inputs connected, respectively, to the corresponding dummy pass transistor, the corresponding row selection output of the row decoder, and the enable output of the control means.

According to an embodiment of the invention, the memory comprises means for precharging the connection between each dummy pass transistor and the corresponding gate when the corresponding row selection output or said enable output is inactive.

According to an embodiment of the invention, each dummy pass transistor is directly controlled by the corresponding row selection output of the row decoder, and the corresponding gate has two inputs connected, respectively, to the dummy pass transistor and to the enable output of the control means.

According to an embodiment of the invention, the memory comprises means for discharging the connection between each dummy pass transistor and the corresponding gate when the corresponding row selection output is inactive.

According to an embodiment of the invention, each dummy pass transistor is directly controlled by the corresponding row selection output of the row decoder, and the corresponding gate has three inputs connected, respectively, to the dummy pass transistor, to the row selection output, and to the enable output of the control means.

According to an embodiment of the invention, the memory comprises means for precharging the connection between each dummy pass transistor and the corresponding gate when the corresponding row selection output is inactive.

According to an embodiment of the invention, the memory comprises other dummy cells for loading each column of the matrix.

The foregoing and other objects, features, aspects and advantages of the invention will become apparent from the following detailed description of embodiments, given by way of illustration and not of limitation with reference to the accompanying drawings.

BRIEF DESCRIPTION OF THE DRAWINGS

In all figures, same elements are designated with same reference characters.

DESCRIPTION OF THE PREFERRED EMBODIMENTS

In a memory architecture according to the invention, for example a static RAM, local reset circuitry is provided for each gate 16, adapted to disable the corresponding row selection line RS as soon as possible after the dummy bit line has discharged to the required threshold. This could be achieved by connecting a third input of each gate 16 directly to the dummy bit line DBL. Then, the gate 16 would be disabled when the dummy bit line DBL has discharged to the switching level of the gate, which corresponds substantially to the threshold of inverter 24. As a consequence, the row selection line is disabled without waiting for the rise of reset signal RST and the subsequent fall of enable signal EN. However, by connecting inputs of gates 16 directly to dummy bit line DBL, the load characteristics of this dummy bit line DBL, are modified, whereby the necessary matching is lost between the dummy bit line DBL and the normal bit lines BL and BL'.

Figure 3:
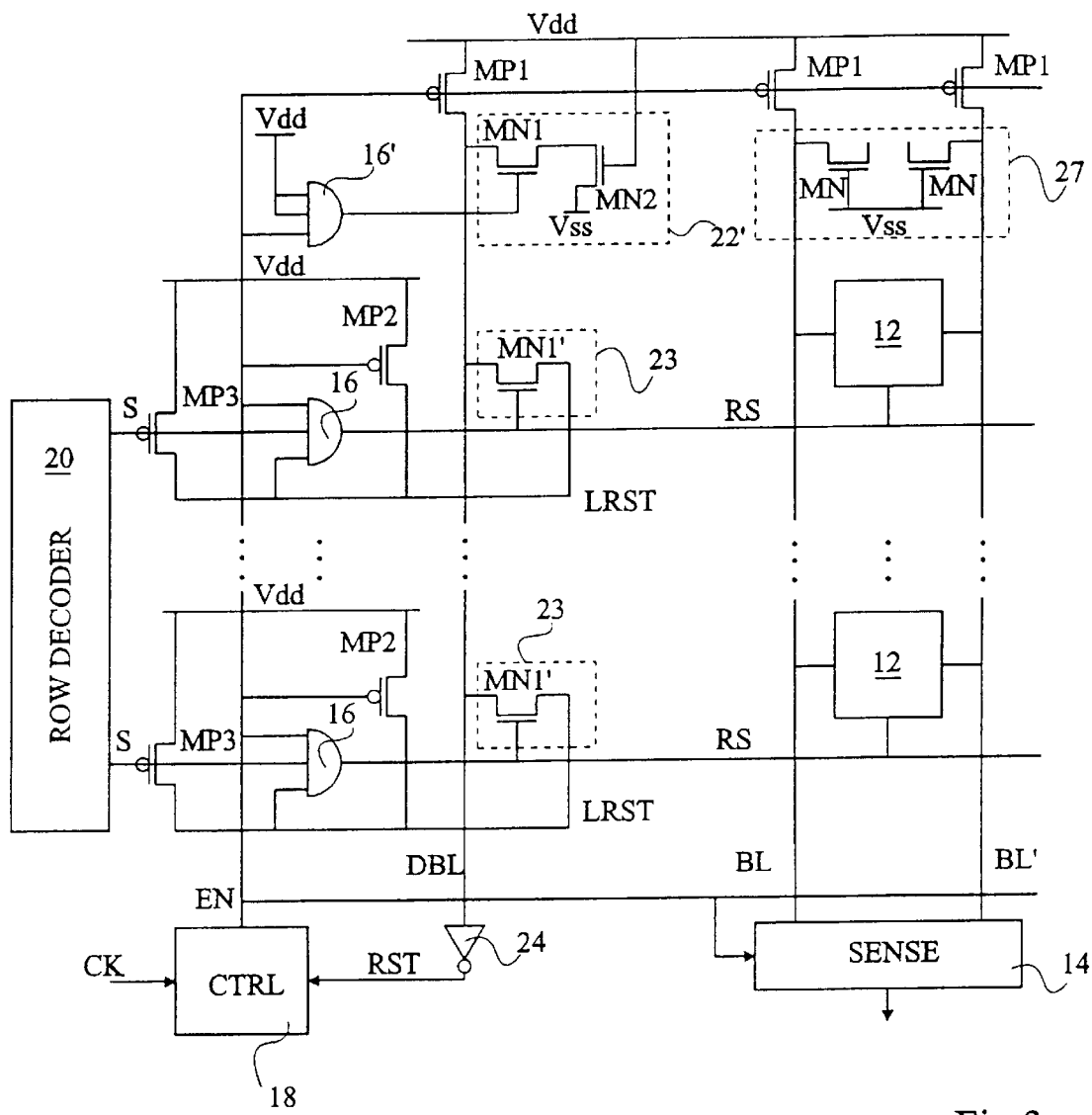
FIG. 3 schematically illustrates a first embodiment of a static RAM architecture according to the invention.

FIG. 3 shows a first embodiment of the invention which avoids this drawback. The gates 16 have three inputs, two of which are connected like the two inputs of gates 16 in FIG. 1. The third input of each gate 16 is connected to a local reset line LRST.

Figure 1:
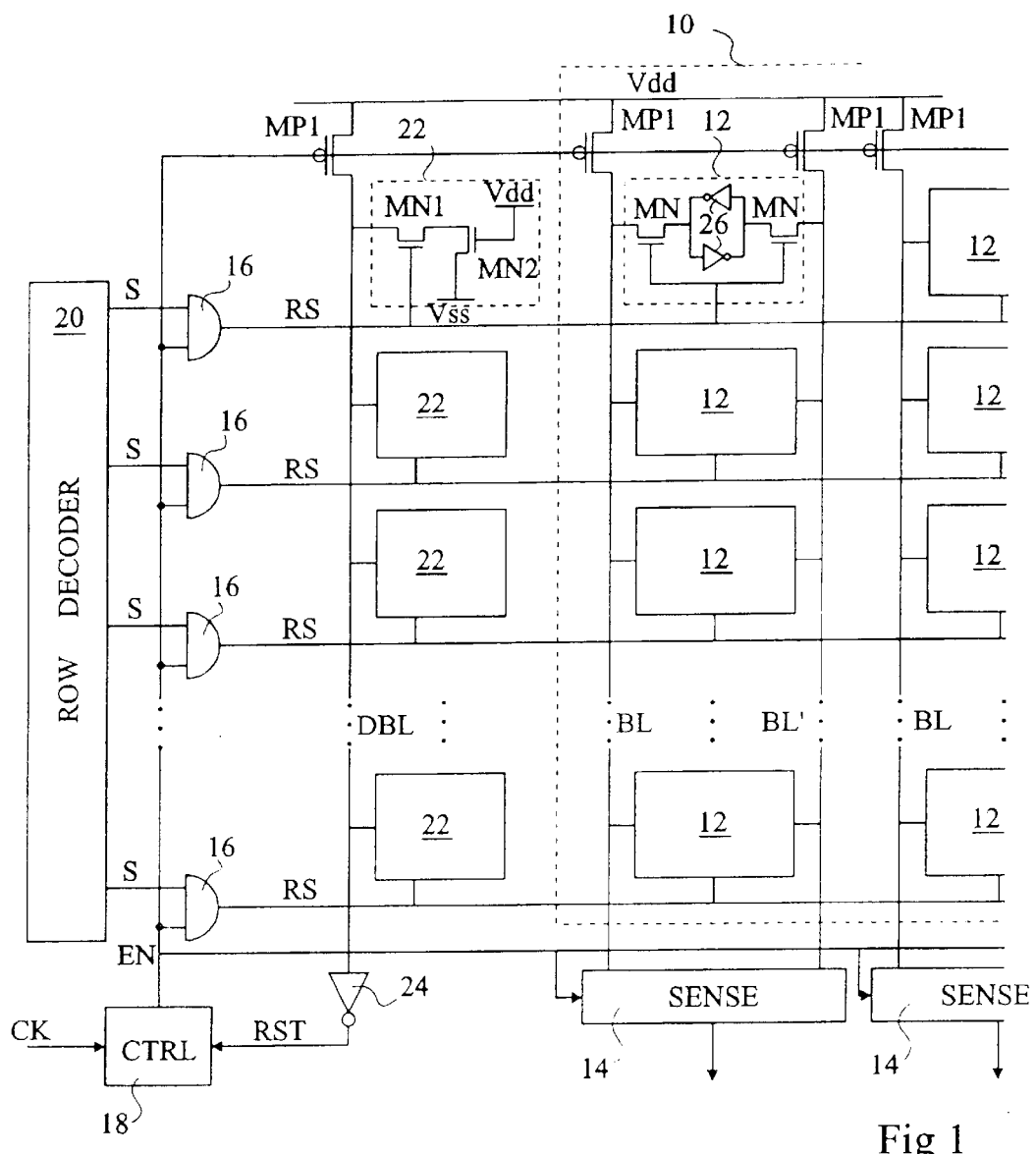
FIGS. 1 and 2, previously described, are intended to illustrate the state of the art and the related problems.
Figure 2:
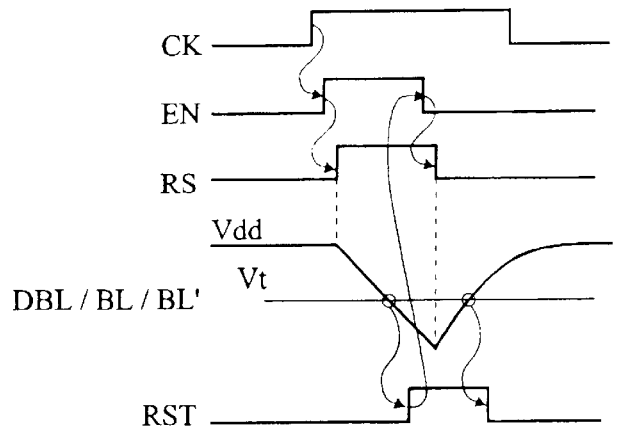

The dummy cells 22 of FIG. 1 are replaced with dummy cells 23 which load the dummy bit line DBL in the same manner, but additionally couple the local reset lines LRST to the dummy line DBL without modifying the load of this dummy line. Each dummy cell 23 comprises a dummy pass transistor MN1' which couples the corresponding local reset line LRST to dummy line DBL. The gate of this pass transistor MN1' is connected to the corresponding row selection line RS.

With this arrangement, the dummy cells 23 do not discharge the dummy bit line DBL. Therefore, an additional discharge dummy cell 22' is provided. This additional dummy cell 22' comprises transistors MN1 and MN2 connected as in the dummy cells 22 of FIG. 1. The gate of transistor MN1 is controlled by the enable signal EN through a three input AND gate 16' serving only to introduce the same delay as the AND gates 16. One input of gate 16' receives the enable signal EN, and the two other inputs are connected to the voltage Vdd. In order to maintain similar properties between dummy line DBL and the normal bit lines BL and BL', dummy pass transistors MN are connected as capacitors between each bit line BL and BL' and voltage Vss and constitute a dummy cell 27 for each column. To more accurately match the output of gate 16' with the row selection lines RS, the output of gate 16' may be connected (not shown) to the gates of transistors MN of the dummy cells 27.

To ensure, if necessary, that the local reset lines LRST do not float when the dummy pass transistors MN1' are off, each line LRST may additionally be coupled to the voltage Vdd through two parallel P-channel MOS transistors MP2 and MP3. The gate of transistor MP2 is controlled by the enable signal EN and the gate of transistor MP3 is controlled by the corresponding selection output S of row decoder 20. Transistors MP2 and MP3 will maintain the local reset lines LRST at a precharged state when the corresponding dummy pass transistors MN1' are off.

Figure 4:
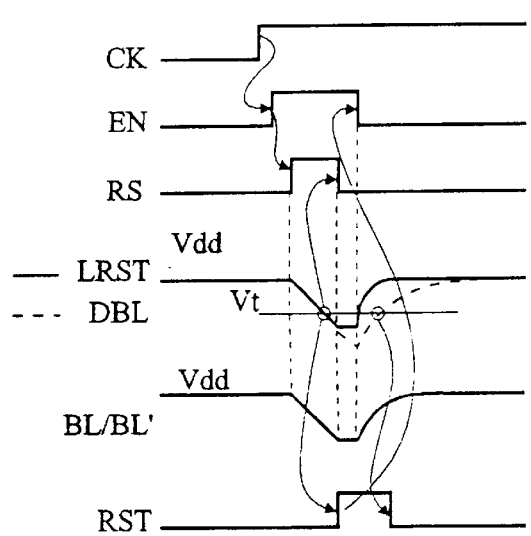
FIG. 4 shows a time diagram illustrating the operation of the static RAM of FIG. 3.

FIG. 4 shows a time diagram illustrating an access cycle of the memory of FIG. 3. The enable signal EN rises shortly after a rising edge of clock signal CK. As the enable signal EN rises, the precharge transistors MP1 are turned off. Shortly afterwards, one row selection line RS is asserted and the output of gate 16' rises at the same time, selecting the additional dummy cell 22' (not shown). As a consequence, the dummy bit line DBL and the normal bit lines start discharging. The local reset line LRST, corresponding to the selected row, follows the evolution of the dummy bit line DBL, since the corresponding pass transistor MN1' is turned on by the row selection line RS.

The row selection line RS is disabled soon after the level of the local reset line LRST, following the evolution of the dummy bit line DBL, reaches the switching threshold Vt of gate 16. Then, the row is no longer selected and the bit lines BL and BL' stop discharging, like line LRST. Line LRST and the bit lines BL and BL' will stay at the level reached until the precharge transistors MP1 are turned on.

Soon after the row selection line RS is disabled, the global reset signal RST rises, since the threshold of inverter 24 is substantially equal to the threshold of gates 16. The rise of signal RST causes the fall of enable signal EN, which in turn causes the lines LRST, DBL, BL and BL' to precharge to the voltage Vdd. Signal RST is disabled as soon as the level of the dummy bit line DBL rises to threshold Vt.

Since the additional dummy cell 22' remains selected between the disabling of row selection line RS and the fall of enable signal EN, the dummy bit line DBL continues discharging during this period. However, this does not represent a significant power consumption, since this discharge only affects the single dummy bit line DBL and not the plurality of normal bit lines.

In a memory according to the invention, the discharge of the bit lines is thus stopped when the switching threshold of the gates 16 is reached, whereby the energy for precharging the bit lines back to their initial value is practically reduced to the minimum possible value. Moreover, since the enable signal EN falls after the disabling of row selection line RS, the precharge transistors MP1 are not turned on while the cells of the selected row are discharging the bit lines. This further reduces the power consumption.

Figure 5:
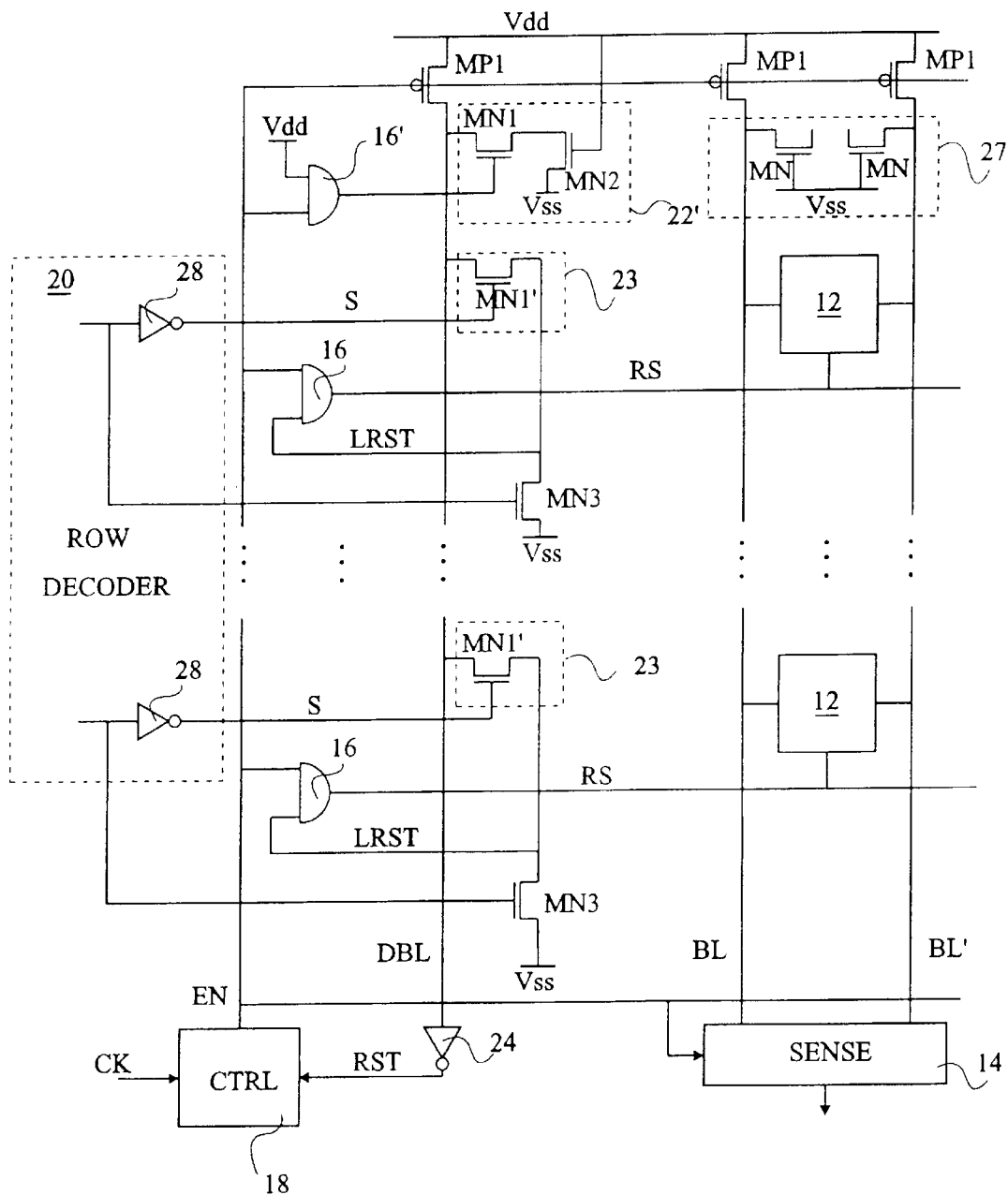
FIG. 5 shows a second embodiment of a static RAM architecture according to the invention.

FIG. 5 shows a second embodiment of a static memory architecture according to the invention. This embodiment differs from the embodiment of FIG. 3 in that the gates of the pass transistors MN1' of the dummy cells 23 are directly connected to the selection outputs S of row decoder 20, and in that each gate 16 only has two inputs, one connected to the local reset line LRST and the other to the enable signal EN. The gate 16', which controls the pass transistor of the additional dummy cell 22', also has two inputs to ensure a closer match with gates 16. Moreover, each local reset line LRST is coupled to the low supply voltage Vss through an N-channel MOS transistor MN3 and the transistors MP2 and MP3 of FIG. 3 are omitted. The gate of transistor MN3 is controlled by the logical complement of the corresponding selection output S. Usually, the selection outputs S are provided by inverters 28 of the row decoder 20. Therefore, transistors MN3 may be controlled by the inputs of inverters 28, as shown. The purpose of each transistor MN3 is to pull the local reset line LRST low when the corresponding selection signal S is inactive, so that the gate 16 cannot be inadvertently enabled when the common enable signal EN is asserted.

This embodiment operates as illustrated in FIG. 4. What cannot be seen in FIG. 4 is that the local reset line LRST of a row to be selected will be connected to the dummy bit line DBL before the row is effectively selected by the corresponding row selection line RS. An advantage of this embodiment is that the gates 16, having only two inputs, are faster than three input gates. Moreover, this embodiment uses less components.

Figure 6:
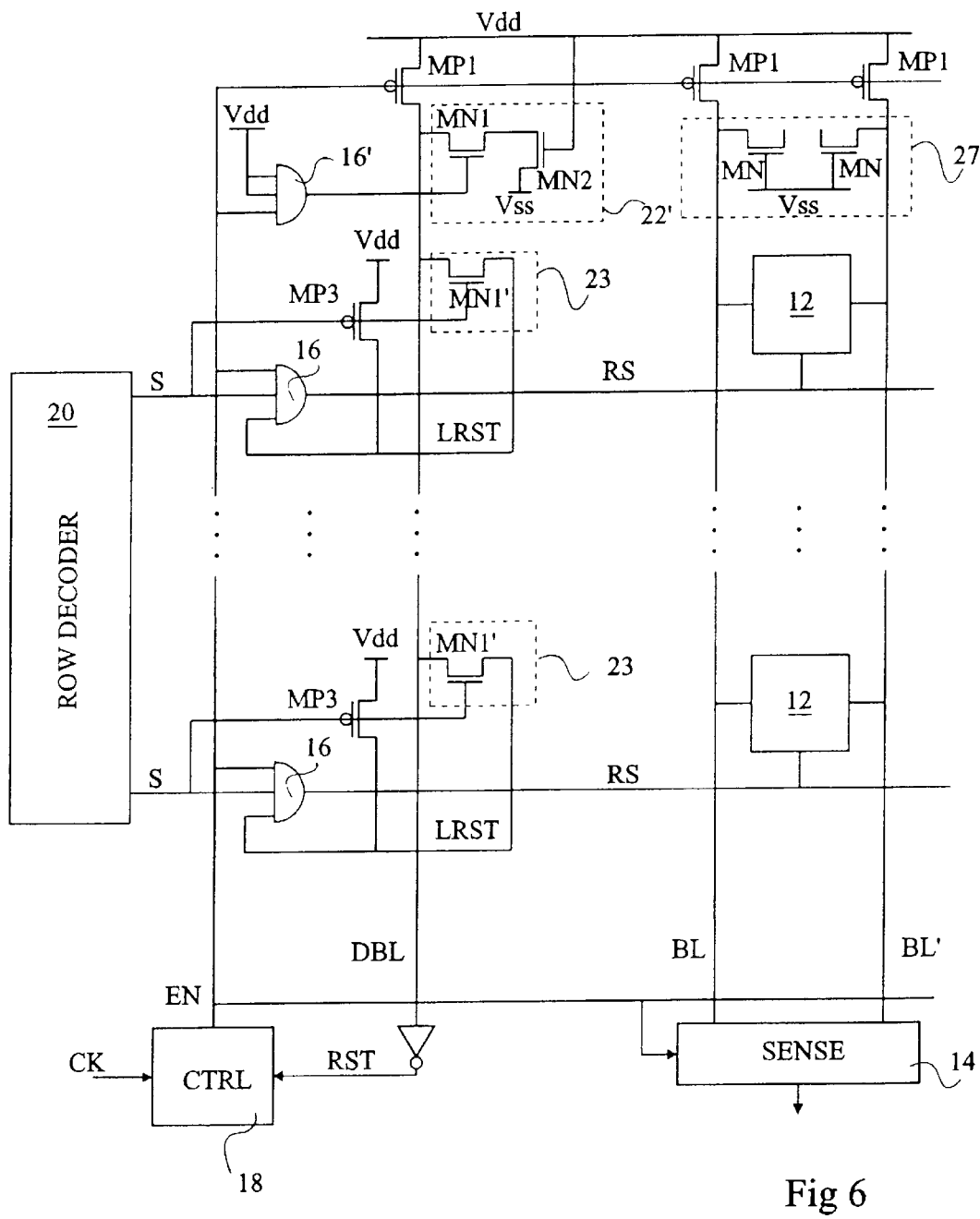
FIG. 6 shows a third embodiment of a static RAM architecture according to the invention.

FIG. 6 shows a third embodiment of a static RAM architecture according to the invention. This embodiment differs from that of FIG. 3 in that the pass transistors MN1' of dummy cells 23 are directly controlled by the selection outputs S of row decoder 20. Transistor MP2 of FIG. 3 is unnecessary and transistor MP3 has the same function as transistor MP3 of FIG. 3. This embodiment operates like the embodiment of FIG. 5.

The invention has been described in relation with static RAMs. It however applies to any memory where a dummy bit line is discharged to detect the completion of an access of the memory.

Many alternatives and modifications of the present invention will appear to those skilled in the art. For example, each of the described transistors may be replaced by a transistor of opposite type, controlled by a complementary signal. The local reset lines LRST may be directly connected to the dummy bit line DBL if the resulting modification of the characteristics of the dummy bit line is controllable and can be compensated by modifying the normal bit lines. Of course, this solution would increase the capacitance of the lines, and thus reduce the speed of operation of the memory.

Such alterations, modifications, and improvements are intended to be within the spirit and scope of the invention. Accordingly, the foregoing description is by way of example only and is not intended to be limiting. The invention is limited only as defined in the following claims and the equivalents thereto.

I claim:

1. A memory comprising:
   a matrix of memory cells;
   a plurality of gates for transmitting respective selection outputs of a row decoder to respective rows of the matrix;
   a dummy bit line having an equivalent load as bit lines associated to columns of the matrix and which is discharged by a dummy memory cell when any row is selected; and
   control circuitry for precharging the bit lines and the dummy bit line when no row is selected, and enabling said gates for transmission of the selection outputs of the row decoder in response to a clock signal;
   wherein each gate has an input coupled to the dummy bit line such that the gate is disabled when the dummy bit line has discharged to a switching threshold of the gate.

2. The memory according to claim 1 wherein the dummy bit line is associated to a dummy column comprising, in each row, a dummy pass transistor which connects the corresponding gate to the dummy bit line at least while the row is selected, and the control circuitry has an enable output for enabling the gates and selecting the dummy memory cell.

3. The memory according to claim 2 wherein each gate has three inputs connected, respectively, to the corresponding dummy pass transistor, the corresponding row selection output of the row decoder, and the enable output of the control circuitry.

4. The memory according to claim 3, further comprising charging circuitry for precharging a connection between each dummy pass transistor and the corresponding gate when the corresponding row selection output or said enable output is inactive.

5. The memory according to claim 2 wherein each dummy pass transistor is directly controlled by the corresponding row selection output of the row decoder, and the corresponding gate has two inputs connected, respectively, to the dummy pass transistor and to the enable output of the control means.

6. The memory according to claim 5, further comprising discharging circuitry for discharging a connection between each dummy pass transistor and the corresponding gate when the corresponding row selection output is inactive.

7. The memory according to claim 2 wherein each dummy pass transistor is directly controlled by the corresponding row selection output of the row decoder, and wherein the corresponding gate has three inputs connected, respectively, to the dummy pass transistor, to the row selection output, and to the enable output of the control circuitry.

8. The memory according to claim 7, further comprising charging circuitry for precharging a connection between each dummy pass transistor and the corresponding gate when the corresponding row selection output is inactive.

9. The memory according to claim 2, further comprising other dummy cells for loading each column of the matrix.

10. A method for accessing a memory including a matrix of memory cells and gates for transmitting selection signals to respective rows of the matrix in response to a common enable signal, the method comprising the steps of:

precharging normal bit lines associated to columns of the matrix and a dummy bit line having an equivalent load as the normal bit lines;

asserting said common enable signal in response to a clock signal;

discharging the dummy bit line;

disabling said common enable signal in response to a reset signal generated when the dummy line has discharged to a predetermined level; and disabling each gate when the dummy bit line has discharged to a switching threshold of the gate.

11. In an integrated random access memory comprised of memory cells in a matrix of rows and columns, each column having two bit lines attached to the cells in the column and the memory having one dummy bit line for each group of columns, a circuit to recharge the bit lines and the dummy bit line when the dummy bit line is discharged to a threshold voltage level, the circuit comprising:

a charging controller having an input and an output, the input connected to the dummy bit line and the output connected to a plurality of charging switches each operable to connect a respective bit line to a charging source;

the charging controller having a first state and a second state where the controller enables the dummy bit line to discharge when in the first state and the controller enables the bit lines and the dummy bit line to recharge when in the second state;

a logic gate for each row of cells in the memory, each logic gate having a plurality of inputs and one output coupled to each cell in the row, the logic output in an active state when the logic gate inputs are in a predetermined state, the active state of the logic gate output to enable the discharge of the bit lines;

the dummy bit line additionally connected to one access switch in each row, each access switch having a control terminal coupled to the output of a respective row decoder having one output for each row of memory cells, the access switch operable to connect the dummy bit line to one of the inputs of the logic gate of the respective row;

wherein each logic gate prevents discharge of the bit lines and the dummy bit line when at least one of the conditions in a group of conditions is present, the group of conditions including the dummy bit line below the voltage threshold level, the charging controller enabling the charging switches, and the row not selected by the row decoder.

12. The circuit of claim 11 wherein the output controller is in the first state when the dummy bit line is above the voltage threshold and wherein the output controller is in the second state when the dummy bit line is below the voltage threshold.

13. The circuit of claim 11 wherein an input of each logic gate is coupled to the output of the respective row decoder.

14. The circuit of claim 11 wherein the memory is a dynamic random access memory.

15. The circuit of claim 11 wherein the charging switches are made of transistors.

16. The circuit of claim 11 wherein the access switches are made of transistors.

17. In an integrated memory, a recharging circuit for charging a group of bit lines to a reference value comprising:

a first circuit path and a second circuit path, each with voltage sensing circuitry that monitors the voltage on a dummy bit line, the dummy bit line for approximating the voltage level of the bit lines at any given time;

the first circuit path connected to circuitry operable to prevent the discharge of the bit lines;

the second circuit path connected to circuitry to recharge the bit lines to the reference voltage level;

wherein each circuit path has a time delay between when the dummy bit line drops below a threshold and when each circuit operates.

18. The recharging circuit of claim 17 wherein the time delay of the first circuit is less than the time delay of the second circuit.

19. A method to recharge bit lines when a representative bit line discharges to a threshold voltage comprising the steps of:

enabling the discharge of some of the bit lines and the representative bit lines;

sensing the voltage of the representative bit line with a first circuit and a second circuit;

preventing further discharge of the bit lines when the representative bit line voltage is sensed by the first circuit to drop below the threshold voltage;

recharging the bit lines when the representative bit line voltage is sensed by the second circuit to drop below the threshold voltage.

* * * * *